US012630943B2

(12) United States Patent
Dong et al.

(10) Patent No.: US 12,630,943 B2
(45) Date of Patent: May 19, 2026

(54) SIMULTANEOUS GROWTH OF EPITAXIAL MONOCRYSTALLINE SILICON CARBIDE LAYERS ON FIRST AND SECOND RESPECTIVE SUBSTRATES

(71) Applicant: KISELKARBID I STOCKHOLM AB, Kista (SE)

(72) Inventors: Lin Dong, Spånga (SE); Kassem Alassaad, Järfälla (SE); Johan Peter Ekman, Saltsjöbaden (SE)

(73) Assignee: KISELKARBID I STOCKHOLM AB, Kista (SE)

( * ) Notice: Subject to any disclaimer, the term of this patent is extended or adjusted under 35 U.S.C. 154(b) by 305 days.

(21) Appl. No.: 18/549,050

(22) PCT Filed: Feb. 18, 2022

(86) PCT No.: PCT/SE2022/050180
§ 371 (c)(1),
(2) Date: Sep. 5, 2023

(87) PCT Pub. No.: WO2022/191753
PCT Pub. Date: Sep. 15, 2022

(65) Prior Publication Data
US 2024/0068127 A1     Feb. 29, 2024

(30) Foreign Application Priority Data

Mar. 11, 2021     (SE) ..................................... 2150279-4

(51) Int. Cl.
*C30B 23/06*          (2006.01)
*C30B 23/02*          (2006.01)
(Continued)

(52) U.S. Cl.
CPC .............. *C30B 29/36* (2013.01); *C30B 23/02* (2013.01); *C30B 35/002* (2013.01)

(58) Field of Classification Search
CPC ..... C30B 23/00; C30B 23/002; C30B 23/005; C30B 23/02; C30B 23/06; C30B 23/063;
(Continued)

(56) References Cited

U.S. PATENT DOCUMENTS 5,746,827 A * 5/1998 Barrett .................... C30B 23/00
117/100
6,261,363 B1 7/2001 Vodakov et al.
(Continued)

FOREIGN PATENT DOCUMENTS

JP          2000219594          8/2000
JP          2004047658          2/2004
(Continued)

OTHER PUBLICATIONS

Furusho T et al, "Effect of Tantalum in Cyrstal Growth of Silicon Carbide by Sublimation Close Space Technique", Japanese Journal of Applied Physics, Japan Society of Applied Physics, JP, (Dec. 1, 2001), vol. 40, No. 12, Part 01, doi:10.1143/JJAP.40.6737, ISSN 0021-4922, pp. 6737-6740, XP001093212 [AD] 1-14.

*Primary Examiner* — Kenneth A Bratland, Jr.
(74) *Attorney, Agent, or Firm* — DUANE MORRIS LLP; Gregory M. Lefkowitz; Brandon A. Chan

(57)          ABSTRACT

Provided is a system (100) for simultaneously producing a first and a second epitaxial monocrystalline layer on a respective first and second substrate, comprising a first inner container (3) defining a first cavity for accommodating a first source material and the first substrate, a second inner container (4) defining a second cavity for accommodating a second source material and the second substrate, an insulation container (6) arranged to accommodate the first and second inner containers (3, 4) therein, an outer container (7) arranged to accommodate the insulation container (6) and the first and second inner containers (3, 4) therein and
(Continued)

100 heating means (8) arranged outside the outer container (7) and configured to heat the first and second cavities simultaneously.

12 Claims, 5 Drawing Sheets

(51) Int. Cl.
  *C30B 29/36* (2006.01)
  *C30B 35/00* (2006.01)

(58) Field of Classification Search
  CPC ....... C30B 23/066; C30B 29/00; C30B 29/10;
    C30B 29/36; C30B 35/00; C30B 35/002;
    C23C 14/00; C23C 14/06; C23C 14/0635;
    C23C 14/22; C23C 14/24; C23C 14/50
  USPC ...... 117/84, 88, 93, 109, 200, 204, 937, 951
  See application file for complete search history.

(56) References Cited

U.S. PATENT DOCUMENTS

| | | | | |
|---|---|---|---|---|
| 7,918,937 | B2 | 4/2011 | Syvaejaervi et al. | |
| 10,793,972 | B1 * | 10/2020 | Xu .......................... | C30B 29/36 |
| 2005/0257734 | A1 | 11/2005 | Madar | |
| 2009/0126624 | A1 * | 5/2009 | Syvajarvi ................ | C30B 23/02 |
| | | | | 117/84 |
| 2013/0305983 | A1 * | 11/2013 | Straubinger ............ | C30B 29/36 |
| | | | | 118/726 |
| 2014/0220298 | A1 * | 8/2014 | Loboda ................. | C30B 23/005 |
| | | | | 118/728 |
| 2014/0220325 | A1 | 8/2014 | Loboda | |
| 2014/0366807 | A1 | 12/2014 | Kim | |
| 2016/0068994 | A1 | 3/2016 | Mueller | |

FOREIGN PATENT DOCUMENTS

| | | |
|---|---|---|
| JP | 2021031311 | 3/2021 |
| KR | 20160121050 | 10/2016 |

* cited by examiner

3a

3b

4a

4b

SIMULTANEOUS GROWTH OF EPITAXIAL MONOCRYSTALLINE SILICON CARBIDE LAYERS ON FIRST AND SECOND RESPECTIVE SUBSTRATES

CROSS-REFERENCE TO RELATED APPLICATIONS

This application is a § 371 national stage entry of International Application No. PCT/SE2022/050180, filed Feb. 18, 2022, which claims priority to Sweden Application No. 2150279-4, filed Mar. 11, 2021, the entire contents of which are incorporated herein by reference.

TECHNICAL FIELD

The present invention relates generally to system and a method for sublimation growth of monocrystalline silicon carbide layers. Specifically, it relates to a system and a method for simultaneously growing two epitaxial monocrystalline silicon carbide layers.

BACKGROUND ART

In recent years, there has been an increasing demand for improved energy efficiency of electronic devices capable of operating at high power levels and at high temperatures. Silicon (Si) is currently the most commonly used material in semiconductors for power devices, and silicon carbide (SiC) is a highly suitable material because of its high thermal conductivity, high saturated electron drift velocity and high breakdown electric field strength.

The most common technique used to grow monocrystalline SiC layers by sublimation is by physical vapor transport (PVT). In this technique, a seed crystal, on which the monocrystalline layer will grow, and a source material are placed in a crucible and are heated to a sublimation temperature of the source material, which is often in the form of a powder. Vapor species from the source material are subsequently deposited on the seed crystal, from which a monocrystalline layer may grow. However, using powder as a source material has several disadvantages. The powder often comprises impurities as a result of the manufacturing process. Furthermore, the heat distribution in the powder is not sufficiently homogenous, resulting in less control of the sublimation of the powder. An additional disadvantage is the risk of solid particles from the powder falling onto the seed, leading to inclusions and impurities in the final crystalline structure.

A version of PVT is the sublimation sandwich method (SSM) where, instead of a powder, a monolithic SiC plate is used as a source material. Using a plate is for example beneficial for controlling the temperature uniformity of the source material. Another advantage of this method is the short distance between source material and seed crystal/ substrate which has the positive effect that vapor species do not react with the walls of the crucible.

However, this process is still time consuming and furthermore not adapted for producing more than one monocrystal at a time. As the demand for SiC monocrystals increases, so does the need to increase production capacity and efficiency while maintaining, or even increasing, quality. A system for simultaneously growing more than one SiC single crystal is disclosed in European Patent Application EP 2 664 695 A1. Two single crystals are produced in two growth compartments respectively, and the source material is contained in a single compartment which feeds both growth compartments. The source material is furthermore in the form of a powder.

Therefore, there is still a need for improved systems and methods which overcome at least some of the problems outlined above.

SUMMARY OF INVENTION

The herein described system and method overcomes these problems by providing a system for simultaneously producing a first and a second epitaxial monocrystalline layer on a respective first and second substrate, comprising a first inner container defining a first cavity for accommodating a first source material and the first substrate, a second inner container defining a second cavity for accommodating a second source material and the second substrate, an insulation container arranged to accommodate the first and second inner containers therein, an outer container arranged to accommodate the insulation container and the first and second inner containers therein and heating means arranged outside the outer container and configured to heat the first and second cavities simultaneously.

By providing two containers defining two cavities both being arranged inside the same insulation container, production capacity can be doubled. Since the production of two monocrystalline layers can be achieved using one system, energy consumption per produced layer is reduced by at least 50%.

In one embodiment of the present disclosure, there is further provided a heating body arranged within the insulation container, between the first and second inner containers, and wherein the heating means is further configured to heat the heating body and the first and second cavities simultaneously.

The heating body has the function of a heat reservoir which distributes heat equally and simultaneously to the system in general, and the first and second cavities specifically. With this arrangement, one single heating body is sufficient for heating two cavities which is more energy efficient and energy consumption can thus be decreased.

In one embodiment of the present disclosure, the first inner container, the second inner container and the heating body are formed in one piece.

In one embodiment of the present disclosure, the first inner container is arranged above the second inner container. Furthermore, the first and second inner containers are cylindrical in shape and have the same diameter.

In one embodiment of the present disclosure, the first inner container comprises an upper part and a bottom part, and the second inner container comprises an upper part and a bottom part, and the bottom part of the first inner container is essentially identical to the upper part of the second inner container.

Having the bottom part of the first inner container essentially identical to the upper part of the second inner container gives the benefit that the thermal drop inside the two cavities is equal.

One embodiment of the present disclosure comprises a first means for arranging the first source material at a predetermined distance from the first substrate in the first cavity and a second means for arranging the second source material at a predetermined distance from the second substrate in the second cavity.

Controlling the distance between the source materials and the respective substrates ensures that the two monocrystalline layers grow simultaneously and homogenously.

In one embodiment of the present disclosure, the first source material is arranged below the first substrate and the second source material is arranged above the second substrate.

This arrangement is especially beneficial when the first inner container is arranged above the second inner container, thus providing the first and second source materials closer to the center of the system. Furthermore, if a heating body is arranged between the inner containers, the source materials would be closer to the heating body and thus have a sufficiently rapid initial temperature increase in order to reach the sublimation temperature sufficiently fast.

In one embodiment of the present disclosure, the insulation container and the outer container are cylindrical in shape, and the first and second source materials and the first and second substrates are disk-shaped.

One embodiment of the present disclosure further comprises a first and a second carbon getter arranged inside the respective first and second inner containers.

In one embodiment of the present disclosure the heating means is movable along the outer container.

This feature gives the effect that the temperature and the thermal drop inside the first and second cavities may be adjusted.

An object of the present disclosure is also to provide a method of simultaneously producing a first and a second epitaxial monocrystalline layer on a respective first and second substrate comprising providing a first inner container defining a first cavity for accommodating a first source material and the first substrate, providing a second inner container defining a second cavity for accommodating a second source material and the second substrate, arranging the first source material and the first substrate in the first cavity, and the second source material and the second substrate in the second cavity, arranging the first and second inner containers within an insulation container, arranging the insulation container within an outer container, providing heating means outside the outer container to heat the first and second cavities simultaneously, evacuating the first and second cavities to a predetermined pressure, introducing an inert gas into the first and second cavities, raising the temperature in the first and second cavities simultaneously to a predetermined growth temperature by the heating means, maintaining the predetermined growth temperature in the first and second cavities until a predetermined thickness of the first and second epitaxial monocrystalline layers on the respective first and second substrates have been achieved, cooling the first and second substrates.

By providing a first and a second inner container and arranging both within the same insulation container, and heating both using the same heating means, two epitaxial monocrystalline layers may be produced simultaneously in one system. The production becomes more energy efficient, space efficient and decreases production time.

In one embodiment of the present disclosure, the first and second source materials are monolithic silicon carbide.

In one embodiment of the present disclosure, the step of arranging the first and second source materials and the first and second substrates in the respective first and second cavities comprises arranging the first source material below the first substrate and arranging the second source material above the second substrate.

In one embodiment of the present disclosure, the step of arranging the first and second inner containers within an insulation container comprises arranging the first inner container above the second inner container.

One embodiment of the present disclosure further comprises providing a heating body between the first inner container and the second inner container.

In one embodiment of the present disclosure the step of raising the temperature of the first and second cavities further comprises simultaneously raising the temperature of a heating body arranged between the first and second inner containers.

BRIEF DESCRIPTION OF DRAWINGS

The invention is now described, by way of example, with reference to the accompanying drawings, in which.

DESCRIPTION OF EMBODIMENTS

In the following, a detailed description of a system 100 and a method for simultaneously producing two SiC monocrystalline layers using SSM will be described with reference to the accompanying drawings. The setup of the system 100 and the method described herein are arranged to simultaneously produce two SiC monocrystalline layers being essentially identical and wherein space required in the system for producing each SiC monocrystalline layer is minimized. The SiC monocrystalline layers may for example be identical in terms of size/dimensions and quality, where quality may be measured for example as number of carbon inclusions and dislocation density or stress in the crystal. Stresses could for example come from warping. The quality of the SiC monocrystalline layers produced using the system and method disclosed herein is furthermore improved compared to using conventional systems and production methods.

Figure 1:
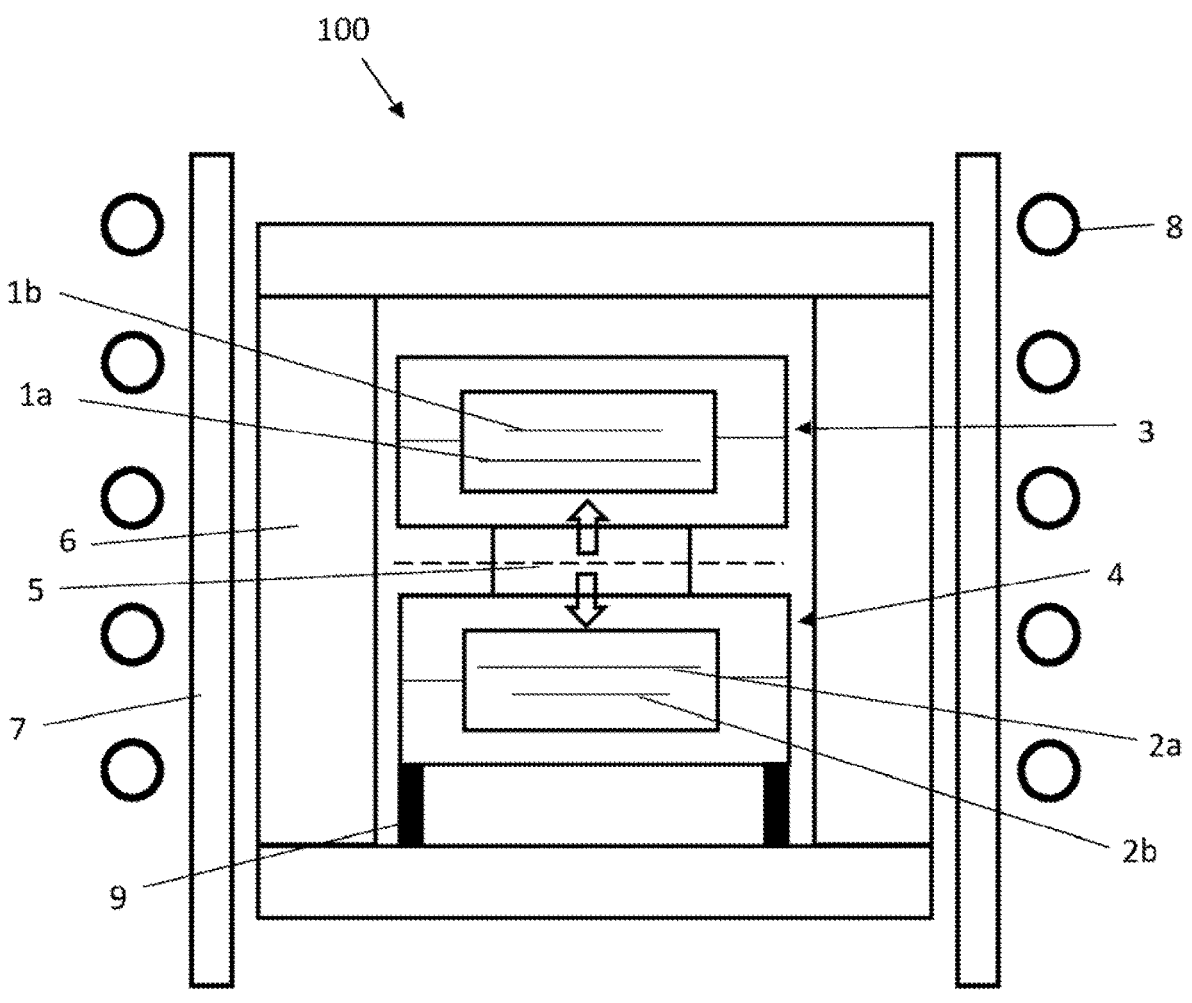
FIG. 1 displays a system according to the present disclosure.

In FIG. 1, the system 100 for simultaneously producing two SiC monocrystalline layers is shown, generally comprising a first inner container 3, a second inner container 4, a heating body 5, an insulation container 6, an outer container 7 and heating means 8. The first inner container 3 defines a first cavity which is arranged to accommodate a first source material 1a and a first substate 1b, and the second inner container 4 defines a second cavity which is arranged to accommodate a second source material 2a and a second substrate 2b.

The setup of the heating body 5 and the first and second inner containers 3, 4 is mirror symmetrical with respect to a plane of symmetry which divides the heating body 5 in two identical parts, the plane of symmetry is represented by a dotted line in FIG. 1. For example, a distance between the heating body 5 and the first source material 1a within the first inner container 3 is equal to a distance between the heating body 5 and the second source material 2a within the second inner container 4. Furthermore, a distance between the first source material 1*a* and the first substrate 1*b* is equal to a distance between the second source material 2*a* and the second substrate 2*b*. The thermal properties provided by the system 100, such as the temperature, the thermal drop and the heating rate, are essentially identical in the first and second cavities. Thus, growth properties for the two SiC monocrystalline layers growing on the respective first and second substrates 1*b*, 2*b* within the first and second inner containers 3, 4 are essentially identical. The result is two essentially identical SiC monocrystalline layers.

In the embodiment shown in FIG. 1, the first inner container 3, the second inner container 4 and the heating body 5 are all arranged within the insulation container 6. The insulation container 6 is arranged within the outer container 7. The heating means 8 is arranged outside and surrounds the outer container 7. The heating means 8 is, during use, arranged to heat the first and second cavities and the heating body 5 simultaneously such that the first and second source materials 1*a*, 2*a* sublime and monocrystalline layers grow on the first and second substrates 1*b*, 2*b*. In the embodiment shown in FIG. 1, the heating means 8 is an induction coil for radiofrequency heating. Furthermore, the heating means 8 is movable along a height direction of the outer container 7, which has the effect that it is possible to adjust the temperature and the thermal drop inside the first and second cavities such that it may be equal in the first and second cavities.

The system 100 further comprises pumps for evacuating the first and second inner containers 3, 4. The pumps may provide a pressure between $10^{-4}$ and $10^{-6}$ mbar in the first and second cavities of the first and second inner containers 3, 4.

In the embodiment shown in FIG. 1, the first inner container 3 is arranged above the second inner container 4, and the heating body 5 is arranged in between, and in contact with, the first and second inner containers 3, 4. In an alternative embodiment the heating body 5 is formed in one piece with the first and second inner containers 3, 4. In an alternative embodiment the heating body 5 is formed in one piece with a bottom part of the first inner container 3 and a upper part of the second inner container 4. The inner containers 3, 4 and the heating body 5 may for example be formed by high density graphite. Furthermore, the heating body 5 may be coated. This setup maximizes the number of SiC monocrystalline layers possible to produce per height unit in the system 100.

In the embodiment shown in FIG. 1, the second inner container 4 is arranged on two container supports 9. The supports rest on the bottom of the insulation container 6 and have a height such that, when the inner containers 3, 4 and the heating body 5 are arranged on the supports 9, an upper surface of the first inner container 3 is at a distance from the upper part of the insulation container 6. Furthermore, the supports 9 may have a height such that a bottom surface of the second inner container 4 is at a distance from a bottom part of the insulation container 6, which is equal to a distance between the upper surface of the first inner container 3 and the upper part of the insulation container 6. In an alternative embodiment the two container supports 9 may be one single container support, or a plurality of container supports. The container supports 9 should be formed of a material bearing high temperature, preferably high-density graphite or a high-melting point metal such as tantalum.

Figure 2A:
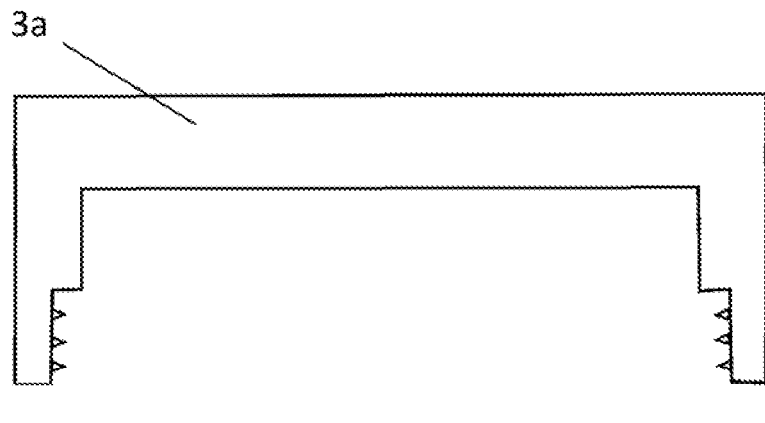
FIGS. 2a-2d display upper and bottom parts of inner containers of the present disclosure, FIG. 3 displays a heating body according to the present disclosure, FIG. 4 displays a first inner container arrangement according to the present disclosure, FIG. 5 displays a carbon getter according to the present disclosure, FIG. 6 displays a second inner container arrangement according to the present disclosure, FIG. 7 displays an insulation container according to the present disclosure, FIG. 8 displays a process flow of a method according to the present disclosure.
Figure 2B:
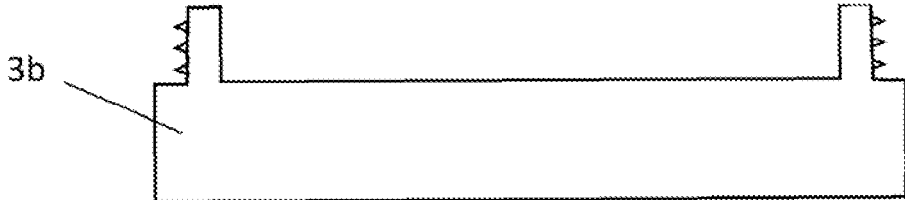

FIG. 2*a* and FIG. 2*b* show the first inner container 3. The first inner container 3 has a cylindrical shape and comprises an upper part 3*a* and a bottom part 3*b*. In the embodiment of FIGS. 2*a* and 2*b*, a bottom edge of the upper part 3*a* is beveled on the inside, and an upper edge of the bottom part

3*b* is equally beveled on the outside, such that the upper part 3*a* and the lower part may be securely fitted together, without either part shifting in a sideways direction when mounted. The upper part 3*a* and the bottom part 3*b*, when fitted together, define the first cavity which is arranged to accommodate the first source material 1*a* and the first substate 1*b*, which will be described more in detail in relation to FIG. 4. The first inner container 3 may be formed from high density graphite, or another suitable material which has the ability to withstand high temperatures and, when a radiofrequency induction coil is used as the heating means 8, which facilitates coupling to said radiofrequency induction coil.

Figure 2C:
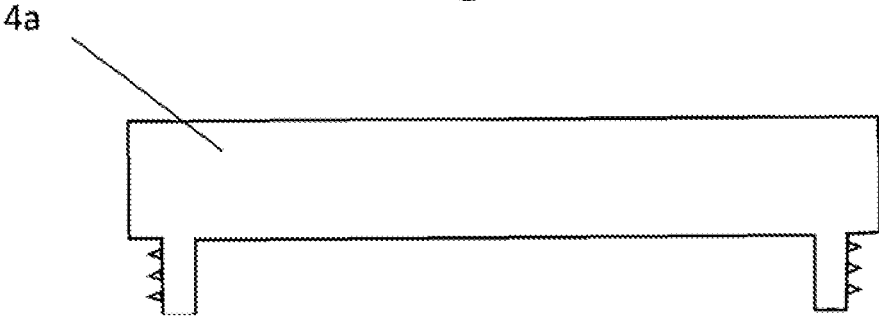
Figure 2D:
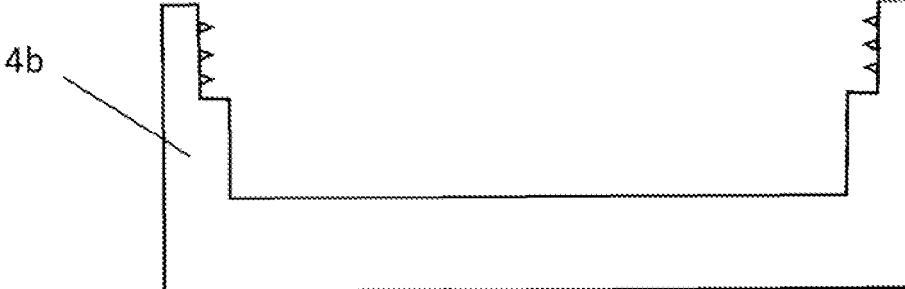

FIG. 2*c* and FIG. 2*d* show the second inner container 4. The second inner container 4 has a cylindrical shape and comprises an upper part 4*a* and a bottom part 4*b*. The upper part 4*a* is essentially identical to the bottom part 3*b* of the first inner container 3. The bottom part 4*b* is essentially identical to the upper part 3*a* of the first inner container 3. Furthermore, the second inner container 4 has an outer diameter and an inner diameter which are essentially identical to the outer and inner diameter of the first inner container 3. Thus, the first and second inner containers are mirror symmetrical with respect to the heating body 5 when arranged above and below the heating body 5. The upper part 4*a* and the bottom part 4*b*, when fitted together, define the second cavity which is arranged to accommodate the second source material 2*a* and the second substate 2*b*, which will be described more in detail in relation to FIG. 6. The second inner container 4 may be formed from high density graphite, or another suitable material which has the ability to withstand high temperatures and, if a radiofrequency induction coil is used as the heating means 8, which facilitates coupling to said radiofrequency induction coil.

Figures 3, 4:
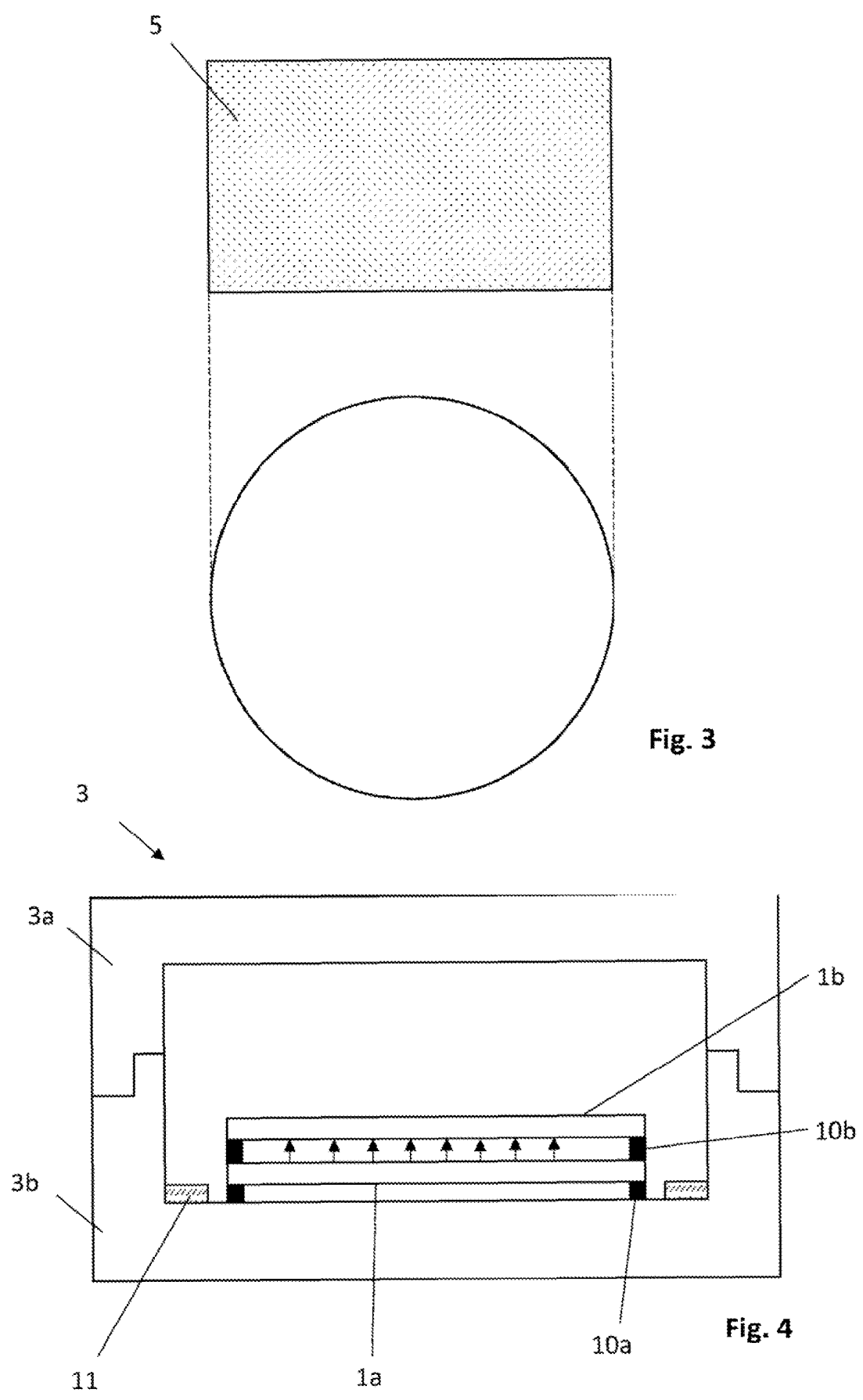

FIG. 3 shows the heating body 5. As mentioned in relation to FIG. 1, the heating body 5 is arranged above the second inner container 4, and below the first inner container 3, and in contact with both the first and second inner containers 3, 4. The heating body 5 is heated simultaneously to the first and second inner containers 3, 4, and has the function of distributing heat to the first and second inner containers 3, 4 so that the temperature distribution in the first and second cavities is essentially equal. The heating body 5 is formed as a solid body having an essentially cylindrical shape. The diameter of the heating body 5 should preferably be 50-150% of the outer diameter of the first and second inner containers 3, 4, more preferably it should be 70-110%. The height of the heating body 5 is preferably between 2 and 4 times greater than the thickness of the bottom part 3*b* of the first inner container (or the top part 4*a* of the second inner container 4), more preferably the height is 2.5-3 times greater. Since only one of the heating body 5 is needed to heat both the first and second cavities, the total height of the system can be decreased compared to if the first and second cavities would require one heating body 5 each. Thus, the number of SiC monocrystalline layers produced per height unit in the system is maximized.

FIG. 4 displays the arrangement of the first source material 1*a* and the first substrate 1*b* within the first inner container 3. The diameter of the first source material 1*a* is preferably larger than the diameter of the first substrate 1*b*. For example, the first substrate 1*b* may have a diameter of 150 mm and the first source material 1*a* may have a diameter of 160 mm. The first source material 1*a* is arranged on at least one first source support 10*a* disposed at the bottom part 3*b* of the first inner container 3. The first source material 1*a* is thereby arranged at a distance from the bottom part 3*b* of the first inner container 3. The first source material 1a may for example a monolithic polycrystalline SiC plate with a columnar micro-grain structure. Other microstructures are also possible. At least one first substrate support 10b is arranged on the first source material 1a and supports the first substrate 1b which is thereby disposed above, and at a distance from, the first source material 1a. Above should be understood as closer to the upper part 3a, and thereby further away from the heating body 5. The distance between the first source material 1a and the first substrate 1b is preferably 0.7-1.2 mm. The at least one first substrate support 10b may for example be in the form of a cube. Furthermore, there may be for example three substrate supports 10b arranged at outer edges of the first source material 1a. In the embodiment shown in FIG. 4, a first carbon getter 11 is arranged at the bottom part 3b of the first inner container 3, which will be further described in relation to FIG. 5.

Figure 5:
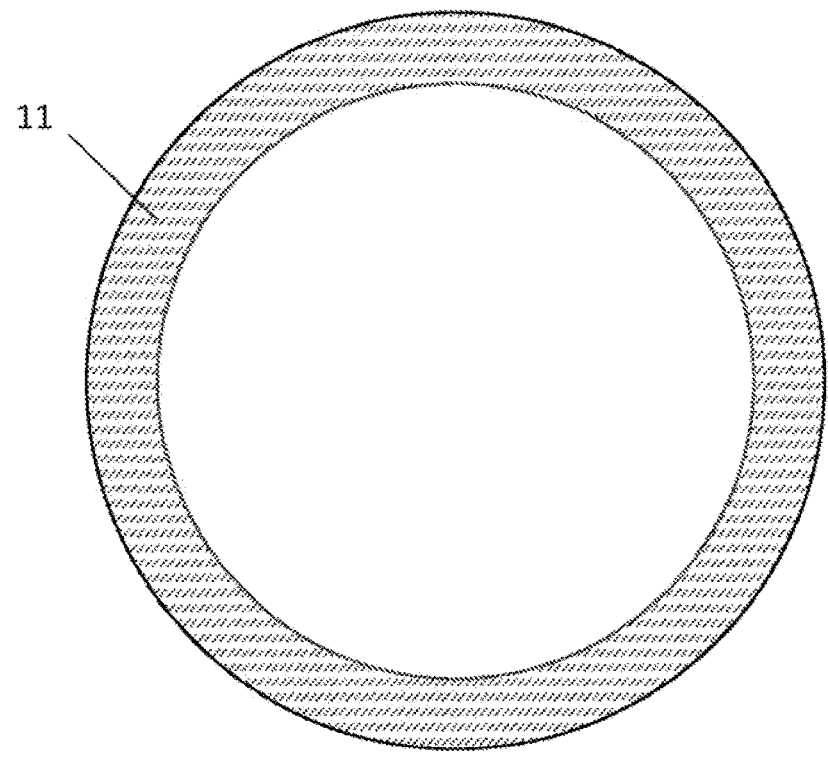

FIG. 5 displays the first carbon getter 11. The carbon getter 11 has a ring shape with an outer diameter essentially equal to, or slightly smaller than, the inner diameter of the first inner container 3. For example, if the inner diameter of the first inner container 3 is 200 mm, the outer diameter of the first carbon getter 11 may be 198 mm. The inner diameter of the carbon getter 11 is greater than the diameter of the first source material 1a, so that the first carbon getter 11 may surround the first source material 1a. For example, if the first source material 1a has a diameter of 160 mm, the first carbon getter 11 may have an inner diameter of 170 mm. The first source support 10a, the first substrate support 10b and the carbon getter 11 are all formed from a material having a melting point above 2200° C. and which has the ability to react with carbon species evaporated from the source material and form a carbide layer. Such materials may be, but are not limited to, tantalum, niobium and tungsten. In an alternative embodiment, the first carbon getter 11 comprises a plurality of parts. Said plurality of parts may be formed by the same or different materials.

Figure 6:
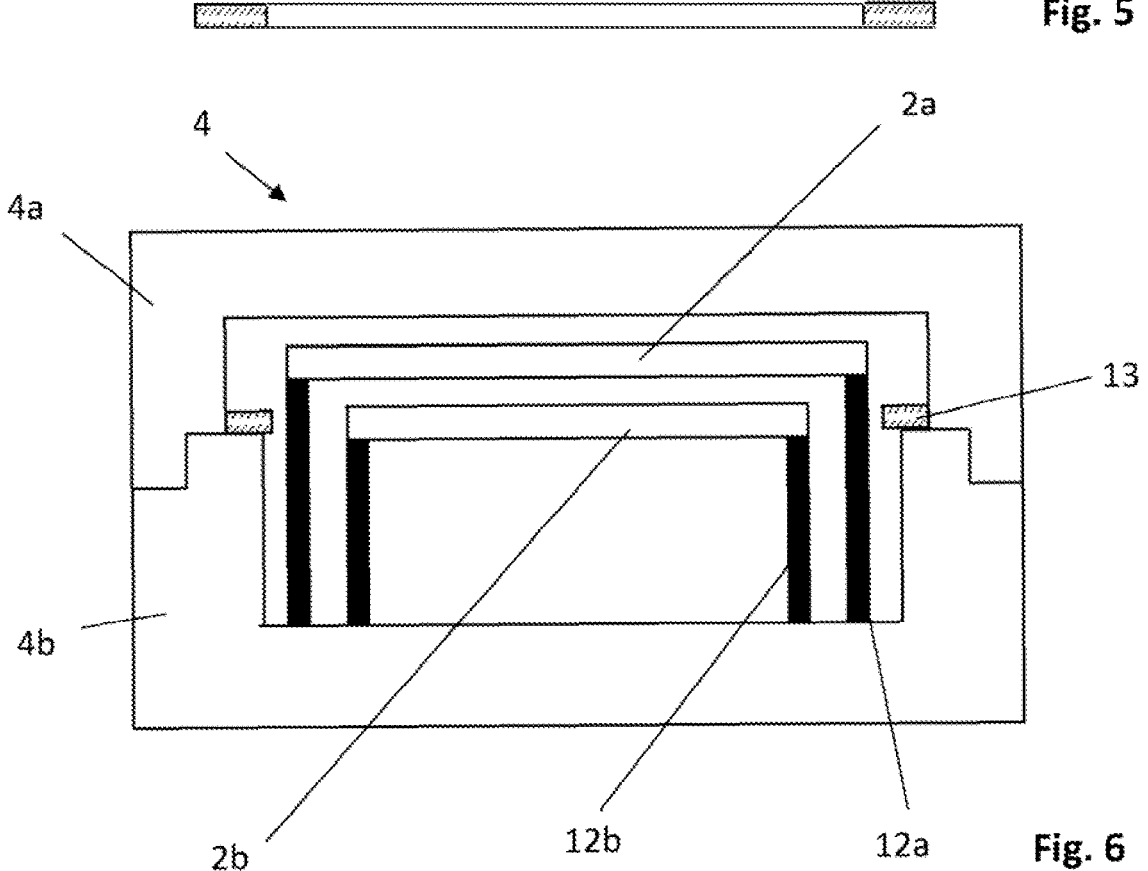

FIG. 6 displays the arrangement of the second source material 2a and the second substrate 2b within the second inner container 4. The diameter of the second source material 2a is larger than the diameter of the second substrate 2b. For example, the second substrate 2b may have a diameter of 150 mm and the second source material 2a may have a diameter of 160 mm. The second substrate 2b is arranged on at least one second substrate support 12b. The at least one second substrate support 12b is disposed on the bottom part 4b of the second inner container 4. The second substrate 2b could be seen as being arranged similarly to how the first source material 1a is arranged in the first inner container 3. The second source material 2a is arranged on at least one second source support 12a. The at least one second source support 12a is also disposed at the bottom part 4b and is furthermore arranged outside the at least one second substrate support 12b, outside should here be understood as further from a center axis of the second inner container 4. The height of the at least one second source support 12a is greater than the height of the at least one second substrate support 12b such that, when the second source material 2a is arranged on the at least one second source support 12a, it is disposed above the second substrate 2b. Above should here be understood as being closer to the upper part 4a, and thus closer to the heating body 5. For example, the inner height of the second inner container 4 may be 20 mm, the height of the at least one second source support 12a may be 17 mm, and the height of the at least one second substrate support 12b may be a height such that the second substrate 2b is arranged below the second source material 2a at a 1 mm distance. The second source material 2a may for example be a monolithic polycrystalline SiC plate with a columnar micro-grain structure and should furthermore be essentially identical to the first source material 1a. Other microstructures for the second source material 2a are possible.

The embodiment of FIG. 6 also comprises a second carbon getter 13. The second carbon getter 13 may have the same shape as the first carbon getter 11, or another shape. The second carbon getter 13 is preferably arranged on a ledge on the inner surface of the second inner container 4. For example, the walls of the bottom part 4b may be thicker than the walls of the upper part 4a and thus, when mounted, an inner edge of the bottom part 4b may extend further towards a center axis of the second inner container 4 and thereby form the ledge. The second carbon getter 13 is formed from a material having a melting point above 2200° C. and which has the ability to react with carbon species evaporated from the source material and form a carbide layer. Such materials may be, but are not limited to, tantalum, niobium and tungsten. In an alternative embodiment, the second carbon getter 13 comprises a plurality of parts. Said plurality of parts may be formed by the same or different materials.

The setup of the first source material 1a and first substrate 1b inside the first inner container 3, and the setup of the second source material 2a and the second substate 2b inside the second inner container 4, provide essentially identical growth properties for the two monocrystalline layers growing on the respective first and second substrates 1b, 2b.

Figure 7:
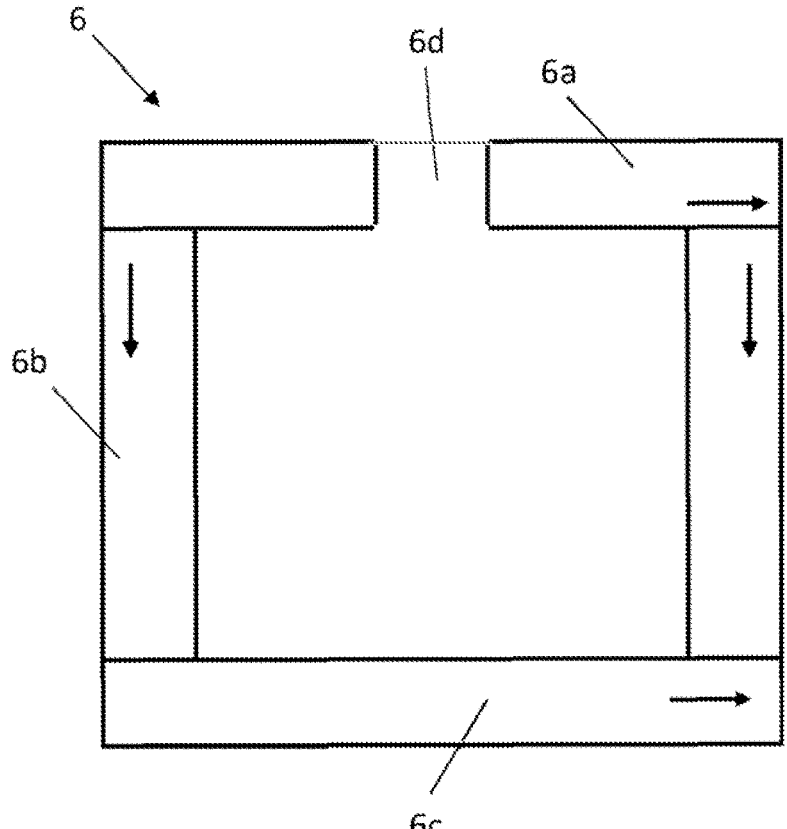

FIG. 7 shows the insulation container 6. The insulation container is preferably cylindrical and formed by high density graphite, and furthermore comprises an upper part 6a, a middle part 6b and a bottom part 6c. The upper part 6a and the bottom part 6c have a fiber direction perpendicular to a center axis of the cylindrical insulation container 6. The middle part 6b has a fiber direction parallel to the center axis. The preferred fiber direction is displayed as arrows in FIG. 7. Having such a fiber direction improves heat dissipation and thereby temperature uniformity inside the insulation container 6. The upper part 6a furthermore comprises a measurement hole 6d. The hole 6d should be adapted to and large enough to receive a measurement equipment, such as a temperature measurement equipment. The measurement hole 6d should furthermore be adapted to maintain a sufficient pressure within the insulation container 6. In an alternative embodiment, the measurement hole is instead arranged in the bottom part 6c. In an alternative embodiment, the upper part 6a and the bottom part 6c each comprises a measurement hole. In an alternative embodiment, the insulation container 6 does not comprise a measurement hole 6d. In this embodiment, the temperature inside the insulation container is calculated from a known energy input to the system. The insulation container 6 is arranged within the outer container 7 on insulation container supports (not shown) positioned at the bottom of the outer container 7. The insulation container 6 is preferably a quartz (SiO2) tube.

The method will now be described with reference to a system design as described above, but the man skilled in the art knows that the design is only an example and other that other designs can also be used as long as the desired growth conditions are achieved.

The method comprises setting up the system 100 in accordance with the above described embodiments, and thereby arranging a first source material 1a and a first substrate 1b in a first inner container, and a second source material 2a and a second substrate 2b in a second inner container, wherein a first and a second SiC monocrystalline layer may grow on a the respective first and second substates 1b, 2b.

Figure 8:
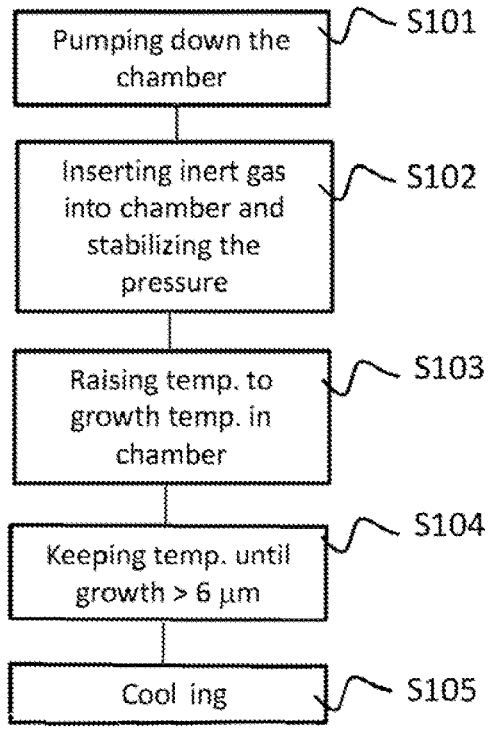

FIG. 8 displays a process flow of the method. The first step is an evacuation step S101 comprising evacuating the system 100 using pumps arranged outside the outer container 7. Specifically, the pressure inside the first and second inner containers 3, 4 should preferably be less than $10^{-4}$ mbar. In the evacuation step S101, the system 100 is pre-heated. The second step is a flushing step S102 where the system 100 is flushed with an inert gas, preferably argon (Ar) gas. After the flushing step S102, the pressure in the system 100 should preferably not exceed 5 mbar, even more preferably 1 mbar. The third step is a heating step S103 where the system 100 is heated to a growth temperature of the monocrystalline layers. An exemplary growth temperature is between 1900-2000° C. During the heating step the temperature is increased at a rate which gives a desired initial sublimation of the first and second source materials and which facilitates nucleation at the substrate. Such a temperature increase is preferably 10-50° C./min, and even more preferably 20-30° C./min. The fourth step is a growth step S104 wherein the temperature in the system is kept constant at the growth temperature while the two monocrystalline layers grow on the respective first and second substrates. The temperature is kept at this temperature until the thickness of the monocrystalline layers reach a desired thickness, preferably at least 50 μm. The fifth step is a cooling step S105, wherein the system 100 and the monocrystalline layers are cooled to room temperature.

Although the present disclosure has been described in detail in connection with the discussed embodiments, various modifications may be made by one of ordinary skill in the art within the scope of the appended claims without departing from the inventive idea of the present disclosure. For example, the system disclosed herein may be suitable to produce monocrystalline layers from other materials than SiC, such as aluminum nitride (AlN). In such a case, naturally other source materials need to be used and the person skilled in the art knows to use source materials with properties essentially equal to those of the source materials disclosed herein. Further, the method can be used to produce more than one layer in the same cavity as is readily realized by the man skilled in the art.

All the described alternative embodiments above or parts of an embodiment can be freely combined without departing from the inventive idea as long as the combination is not contradictory.

The invention claimed is:

1. A system for simultaneously producing a first and a second epitaxial monocrystalline layer on a respective first and second substrate, comprising:
   a first inner container defining a first cavity for accommodating a first monolithic silicon carbide source material and the first substrate, the first monolithic silicon carbide source material being arranged below the first substrate;
   a second inner container defining a second cavity for accommodating a second monolithic silicon carbide source material and the second substrate, the second monolithic silicon carbide source material being arranged above the second substrate;
   an insulation container arranged to accommodate the first and second inner containers therein;

an outer container arranged to accommodate the insulation container and the first and second inner containers therein; and
   heating means arranged outside the outer container and configured to heat the first and second cavities simultaneously;
   wherein the first inner container is arranged above the second inner container.

2. The system according to claim 1, further comprising a heating body arranged within the insulation container, between the first and second inner containers, and wherein the heating means is further configured to heat the heating body and the first and second cavities simultaneously.

3. The system according to claim 2, wherein the first inner container, the second inner container and the heating body are formed in one piece.

4. The system according to claim 1, wherein the first and second inner containers are cylindrical in shape and have the same diameter.

5. The system according to claim 1, wherein
   the first inner container comprises an upper part and a bottom part;
   the second inner container comprises an upper part and a bottom part; and
   the bottom part of the first inner container is essentially identical to the upper part of the second inner container.

6. The system according to claim 1, further comprising
   a first means for arranging the first monolithic silicon carbon source material at a predetermined distance from the first substrate in the first cavity; and
   a second means for arranging the second monolithic silicon carbon source material at a predetermined distance from the second substrate in the second cavity.

7. The system according to claim 1, wherein the insulation container and the outer container are cylindrical in shape, and the first and second monolithic silicon carbide source materials and the first and second substrates are disk-shaped.

8. The system according to claim 1, further comprising
   a first carbon getter arranged inside the first inner container, and
   a second carbon getter arranged inside the second inner container.

9. The system according to claim 1, wherein the heating means is movable along the outer container.

10. A method of simultaneously producing a first and a second epitaxial monocrystalline layer on a respective first and second substrate comprising:
   providing a first inner container defining a first cavity for accommodating a first monolithic silicon carbon source material and the first substrate;
   providing a second inner container defining a second cavity for accommodating a second monolithic silicon carbon source material and the second substrate;
   arranging the first monolithic silicon carbon source material below the first substrate in the first cavity and the second monolithic silicon carbon source material above the second substrate in the second cavity;
   arranging the first and second inner containers within an insulation container, wherein the first inner container is arranged above the second inner container;
   arranging the insulation container within an outer container providing heating means outside the outer container to heat the first and second cavities simultaneously;
   evacuating the first and second cavities to a predetermined pressure;
   introducing an inert gas into the first and second cavities;

raising the temperature in the first and second cavities simultaneously to a predetermined growth temperature by the heating means;

maintaining the predetermined growth temperature in the first and second cavities until a predetermined thickness of the first and second epitaxial monocrystalline layers on the respective first and second substrates have been achieved;

cooling the first and second substrates.

11. The method according to claim 10, further comprising providing a heating body between the first inner container and the second inner container.

12. The method according to claim 11, wherein the step of raising the temperature of the first and second cavities further comprises simultaneously raising the temperature of the heating body.

\* \* \* \* \*